United States Patent
Bauchot et al.

(10) Patent No.: US 9,261,128 B2
(45) Date of Patent: *Feb. 16, 2016

(54) ANTI-TAMPER SYSTEM

(71) Applicant: International Business Machines Corporation, Armonk, NY (US)

(72) Inventors: Frederic J. Bauchot, Saint-Jeannet (FR); Jean-Yves Clement, Saint-Jeannet (FR); Ricardo Klatovsky, Madrid (ES); Jean-Christophe Samin, Barcelona (ES)

(73) Assignee: International Business Machines Corporation, Armonk, NY (US)

( * ) Notice: Subject to any disclaimer, the term of this patent is extended or adjusted under 35 U.S.C. 154(b) by 280 days.

This patent is subject to a terminal disclaimer.

(21) Appl. No.: 14/045,259

(22) Filed: Oct. 3, 2013

(65) Prior Publication Data

US 2014/0030041 A1   Jan. 30, 2014

Related U.S. Application Data

(63) Continuation of application No. 13/856,658, filed on Apr. 4, 2013, now Pat. No. 8,858,140.

(30) Foreign Application Priority Data

Jun. 1, 2012   (EP) .................................... 12382225

(51) Int. Cl.
*E01B 9/12* (2006.01)
*F16B 39/02* (2006.01)
(Continued)

(52) U.S. Cl.
CPC ............... *F16B 39/02* (2013.01); *E05B 13/001* (2013.01); *E05B 19/0005* (2013.01);
(Continued)

(58) Field of Classification Search
CPC .................................. F16B 19/04; E01B 9/12
USPC .......................... 411/166, 337, 432, 439, 501
See application file for complete search history.

(56) References Cited

U.S. PATENT DOCUMENTS 3,060,786 A   10/1962   Flower
4,537,543 A    8/1985   Scott et al.
(Continued)

FOREIGN PATENT DOCUMENTS

CN   201820343   5/2011

OTHER PUBLICATIONS

International Application No. PCT/IB2013/054221, PCT International Search Report and Written Opinion, GB120014, Oct. 3, 2013, 13 pages.

(Continued)

*Primary Examiner* — Roberta Delisle
(74) *Attorney, Agent, or Firm* — Douglas A. Lashmit; Hoffman Warnick LLC (57) ABSTRACT

An anti-tamper system including: a fixing device and an anti-tamper detection device; the fixing device comprising a body and a head whereby the head having a larger cross section then the body for enabling a tool to engage and drive the body into a first material layer thereby makes a firm connection with the anti-tamper detection device between the head and the first material layer; the fixing device further comprising a lock wherein the head is locked to the body by the lock where there is no external magnetic field and wherein the head becomes disengaged from the body when the lock is unlocked by an external magnetic field; and whereby the anti-tamper detection device detects and records a change the connection when the head becomes disengaged.

15 Claims, 12 Drawing Sheets (51) Int. Cl.

| | | |
|---|---|---|
| *F16B 15/00* | (2006.01) | |
| *F16B 19/04* | (2006.01) | |
| *E05B 19/00* | (2006.01) | |
| *E05B 39/00* | (2006.01) | |
| *E05B 65/00* | (2006.01) | |
| *E05B 13/00* | (2006.01) | |
| *G01R 22/06* | (2006.01) | |
| *F16B 41/00* | (2006.01) | |

(52) U.S. Cl.
CPC ............ *E05B 39/00* (2013.01); *E05B 65/0021* (2013.01); *E05B 65/0089* (2013.01); *F16B 15/00* (2013.01); *F16B 19/04* (2013.01); *G01R 22/066* (2013.01); *F16B 41/005* (2013.01)

(56) References Cited

U.S. PATENT DOCUMENTS

| | | | |
|---|---|---|---|
| 4,542,337 A | 9/1985 | Rausch | |
| 4,583,483 A | 4/1986 | Rausch | |
| 4,927,305 A | 5/1990 | Peterson, Jr. | |
| 5,086,292 A | 2/1992 | Johnson et al. | |
| 5,486,755 A | 1/1996 | Horan et al. | |
| 5,758,913 A | 6/1998 | Roth et al. | |
| 6,239,588 B1 | 5/2001 | Tiemann | |
| 7,495,555 B2 | 2/2009 | Seal et al. | |
| 7,798,757 B2 | 9/2010 | Kawano et al. | |
| 8,040,244 B2 | 10/2011 | Bauchot et al. | |
| 2009/0038019 A1 | 2/2009 | Tatai et al. | |
| 2009/0107253 A1 | 4/2009 | Armas et al. | |
| 2010/0072989 A1 | 3/2010 | Graff | |
| 2010/0245089 A1 | 9/2010 | Woods | |

OTHER PUBLICATIONS

Eaton, "Smart Metering: The intelligent infrastructure", http://demo.screenteam.at/moeller_en/download/eaton/smart_metering_data_en.pdf, 2010, 10 pages.

U.S. Appl. No. 13/856,658, Notice of Allowance, May 27, 2014, GB920120014US1, 5 pages.

U.S. Appl. No. 13/856,658, Office Action, May 6, 2014, GB920120014US1, 15 pages.

ANTI-TAMPER SYSTEM

REFERENCE TO PRIOR APPLICATIONS

The current application is a continuation application of U.S. Utility application Ser. No. 13/856,658, which was filed on 4 Apr. 2013, which is hereby incorporated by reference, and which claimed the benefit of European Patent Application No. EP12382225.6, which was filed on 1 Jun. 2012.

TECHNICAL FIELD

This invention relates to an anti-tamper screw. In particular the invention relates to an anti-tamper screw for detecting magnetic tampering that can be retro-fitted to an existing anti-tampering mechanism.

RELATED ART

The invention operates in the general environment of smart meters where an operator does not want unauthorized access to the smart meter nor magnetic tampering.

Tests have shown that magnetic tampering using a permanent magnet placed in the vicinity of a smart meter results in a lower energy consumption reading. A permanent magnet placed near the meter causes a static magnetic disturbance field. Furthermore, the operational point of a current sensing technology in smart meters can be shifted by applying an external static magnetic field. As a result, the current transformer will measure less current and the meter will count less consumption. Both uses of permanent magnets represent a significant business risk.

U.S. Pat. No. 4,542,337 discloses an electro-mechanical anti-tampering device for electric meters. The device can readily be installed or retrofitted into existing meters as by drilling, tapping, and installing utilizing screws and performing simple electrical attachments into the meter itself.

U.S. 2009/0107253 discloses a magnetic water shield for water meters. The shield may be mounted to the water meter via an anti-tamper screw. The anti-tamper screw may include a wire passing therethrough that would have to be disconnected in order to remove the anti-tamper screw.

U.S. 2009/0038019 discloses a tamper detection mechanism and card processing device. A tamper detection mechanism for detecting tampering when a sub-system is removed from a host device includes: a screw member which is composed of a head portion, a major diameter shaft portion, and a minor diameter shaft portion, for fixing the sub-system to the host device as a thread portion formed on the minor diameter shaft portion is screwed into a screw hole of the host device; a through hole which is provided in the sub-system and through which the major diameter shaft portion passes; a lever member which withdraws from the through hole as it is pushed by the major diameter shaft portion when the screw member is tightly screwed and which advances into the through hole when the screw member is loosened; and a detection switch for detecting the tightly screwed or loosened condition of the screw member based on the withdrawal or advancement of the lever member.

SUMMARY

In a first aspect of the invention there is provided a fixing device comprising: a body and a head, the head having a larger cross section than the body for enabling a tool to engage and drive the body into a first material layer to compress a second material layer between the head and the first layer; and a lock for locking the head to the body and for disengaging the head from the body in response to an external magnetic field.

The large cross section of the head abuts the first material or anything in between for stopping the body penetrating into the material.

The proposed embodiments attempt to be less "meter intrusive" than the prior art. In particular, the embodiments attempt to minimize: the time and effort needed to update current meters; the need to re-set the meter; and any additional burden for handling such a tamper event detection.

Advantageously the lock comprises one or more moveable parts being sensitive to a magnetic field so to move and unlock the head from the body when an external magnetic field is applied. The moveable part may comprise, for example, a bearing (e.g., bearing B1, FIG. 5) or a magnet (e.g., magnet 804, FIG. 12B).

The lock may be biased by a threshold force in an unstable equilibrium position whereby when an external magnetic counterforce greater than the threshold force is applied then the lock moves to a more stable equilibrium position thereby unlocking the head from the body. The threshold forces may be provided, for example, by springs or magnets.

The lock may be biased by two or more springs in an unstable equilibrium position whereby when a magnetic counterforce greater than the force of the springs is applied then the lock moves to a more stable equilibrium position thereby unlocking the head from the body. The springs may comprise, for example, tension and/or compression springs. Coil springs have the advantage that they are simple to use. Elastic spring material can also be used and has the advantage that it has fewer moving parts.

The lock may be biased by two or more permanent magnets in an unstable equilibrium position whereby when an external magnetic counterforce greater than the equilibrium forces is applied then the lock moves to a more stable equilibrium position whereby the corresponding movement unlocks the head from the body.

Embodiments are described below in terms of a screw having a head and screw body. However, other types of fixings device could be used including: bolts; nails; and rivets.

In a second aspect of the invention there is provided an anti-tamper system comprising: a fixing device; an anti-tamper detection device; the fixing device comprising a body and a head, the head having a larger cross section than the body for enabling a tool to engage and drive the body into a first material layer to form a firm connection with the anti-tamper detection device between the head and the first material layer; the fixing device further comprising a lock for locking the head to the body when there is no external magnetic field and for disengaging the head from the body when the lock is unlocked by an external magnetic field; and wherein the anti-tamper detection device detects and records a change in the connection when the head becomes disengaged from the body.

A spring may be placed between the fixing device and the first material thereby creating a bias to remove the head from the body when the lock is unlocked.

BRIEF DESCRIPTION OF DRAWINGS

Embodiments of the present invention will now be described, by way of example only, with reference to the following drawings.

DETAILED DESCRIPTION

Figure 1:
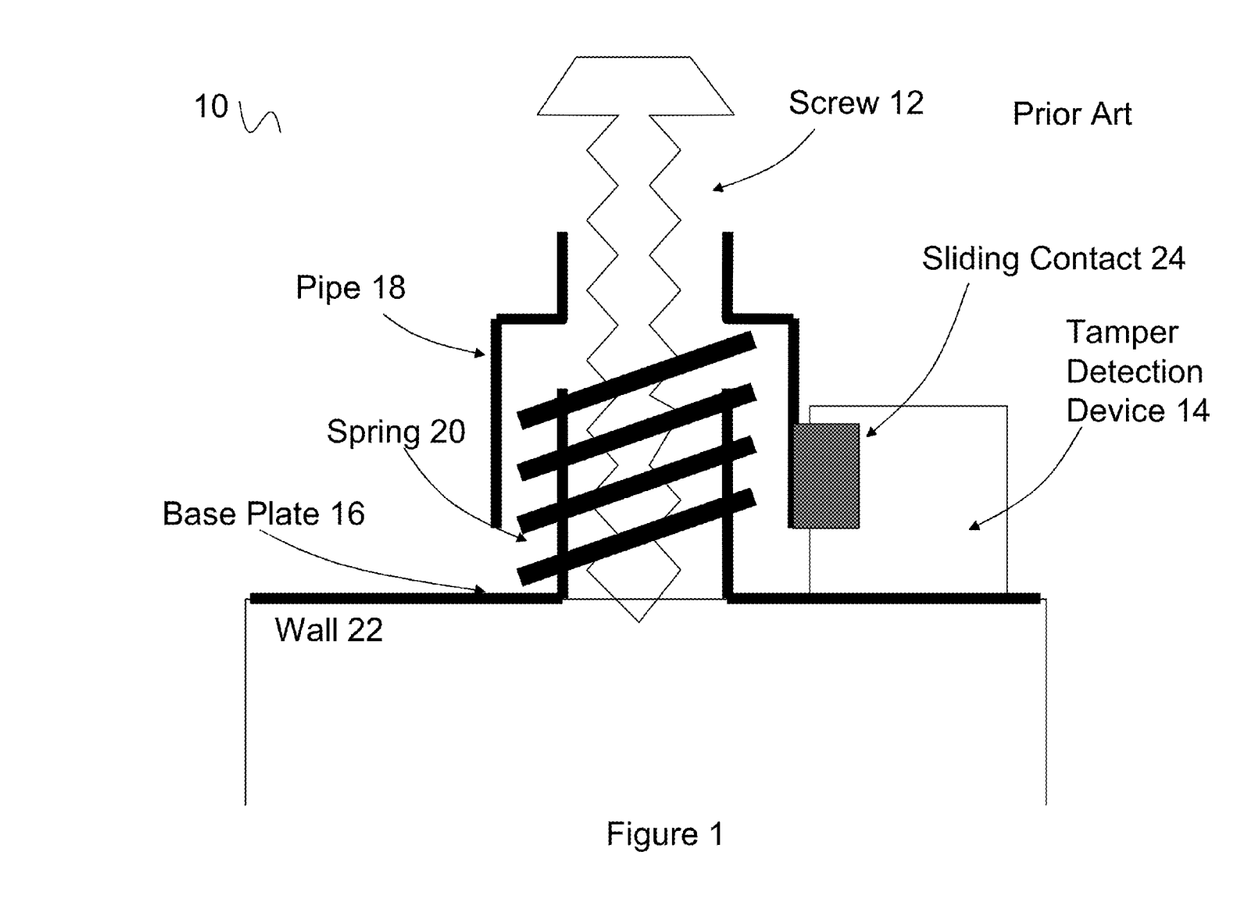
FIG. 1 is an exploded component diagram of a prior art fixture before locking

Referring to FIG. 1, a prior art anti-tamper fixture system 10 for smart meter closure is shown. The prior art anti-tamper fixture system 10 includes: a fixing device (screw 12); a tamper detection device 14; a base plate 16; a pipe 18; and a spring 20. The fixture system 10 is fixable to a wall 22 of a closure that seals a smart meter closed.

The screw 12 fixes the detection device 14 to the wall 22 and the detection device 14 will detect and record if the screw 12 is removed. This allows a service operator to tell if an unauthorized attempt has been made to open the smart meter closure.

The tamper detection device 14 is an electronic device that records when an electric circuit is broken. The pipe 18 includes a sliding contact 24 that makes an electric circuit in the tamper detection device 14 when the screw 12 fixes the tamper detection device 14 to the smart meter closure wall 22. When the screw 12 is not fixing the tamper detection device 14 to the smart meter closure wall 22 then the electrical circuit is broken and this is recorded by the tamper detection device 14.

The base plate 16 comprises a plate with a hole and a flange around the hole. The flange is for positioning spring 20 over the hole. The flange is cylindrical and extends perpendicularly to the plate. FIG. 1 shows the wall 22, the base plate 16, the spring 20, and the pipe 18 in an exploded arrangement before the screw 12 is introduced.

The spring 20 applies a pressure that pushes the base plate 16 and the pipe 18 apart. The spring 20 fits concentrically over the base plate hole by fitting around the flange. One end of spring 20 sits on the base plate 16 and the other end of the spring 20 abuts the pipe 18.

The pipe 18 compresses the spring 20. The pipe 18 fits concentrically over the hole and comprises a first edge for abutting the screw 12, a second edge for abutting one end of the spring 20, and a third edge for fitting around the spring 20.

The screw 12 fixes the pipe 18, the spring 20, and the base plate 16 to the wall 22 by embedding thread end of the screw 12 into the wall 22 while the head of the screw 12, having a larger diameter than the pipe 18, presses on the pipe 18 and forces the pipe 18 against the wall 22 with the base plate 16 and the spring 20 in between.

Figure 2:
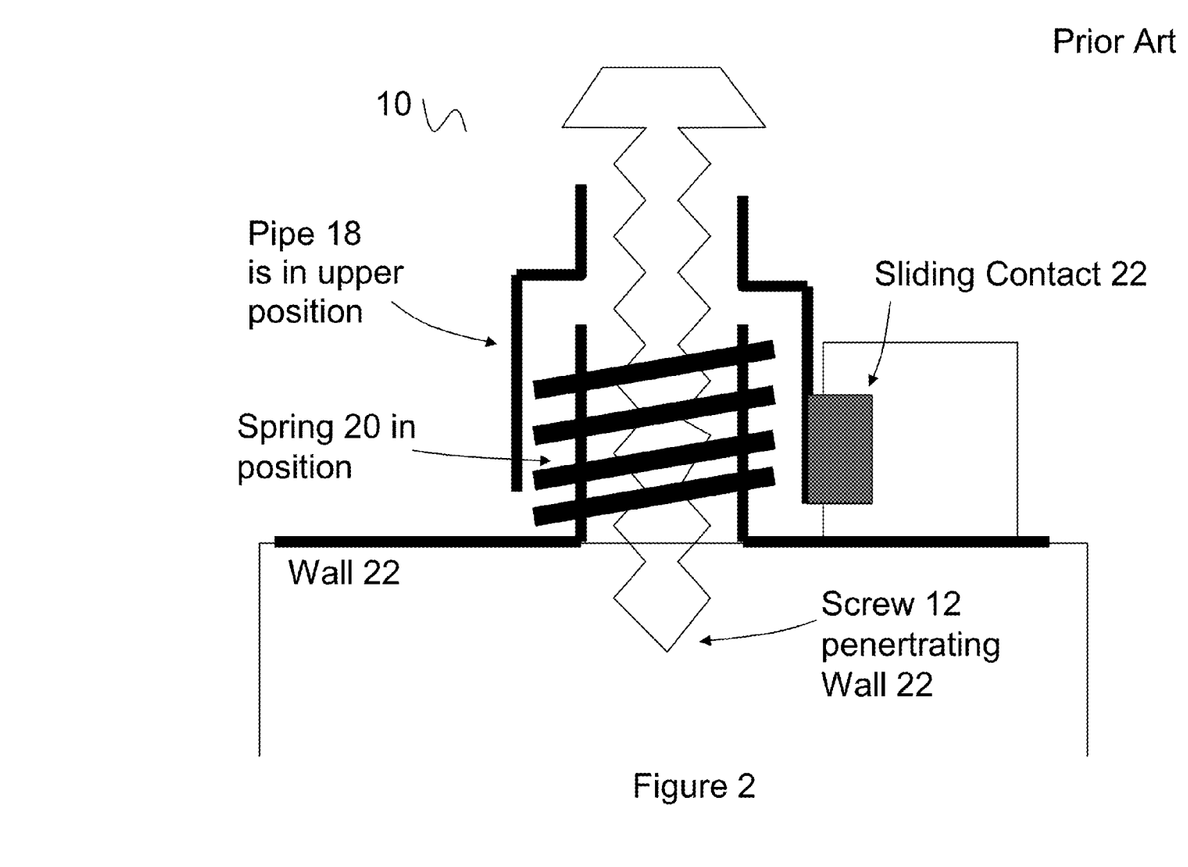
FIG. 2 is a component diagram of the prior art anti-tamper fixture of FIG. 1 during fitting.

Referring to FIG. 2, the fixing system 10 is shown during fitting with the components closer together but not quite in contact.

Figure 3:
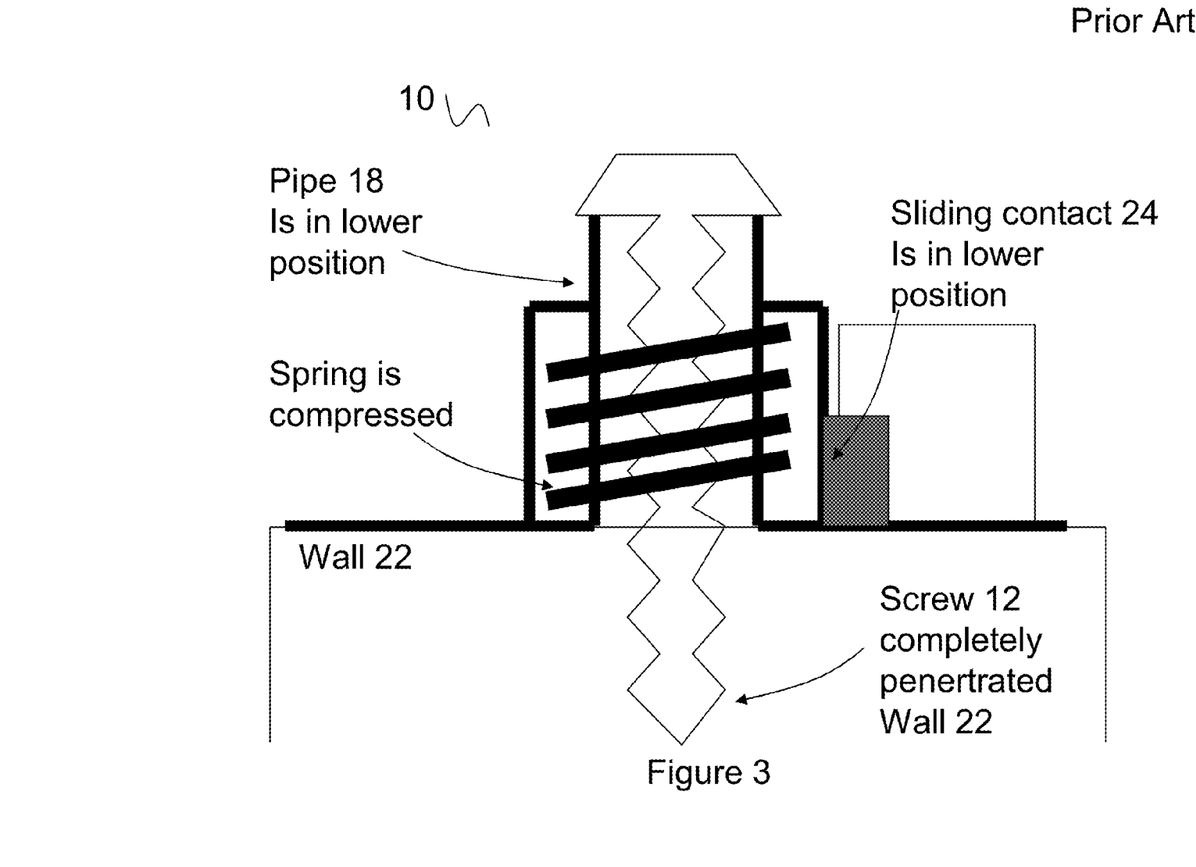
FIG. 3 is a component diagram of the prior art anti-tamper fixture of FIGS. 1 and 2 after fitting.

Referring to FIG. 3, the fixing system 10 shows the wall 22, the base plate 16, the spring 20, the pipe 18 and the screw 12 in a locked arrangement after the screw 12 is introduced.

Figure 4:
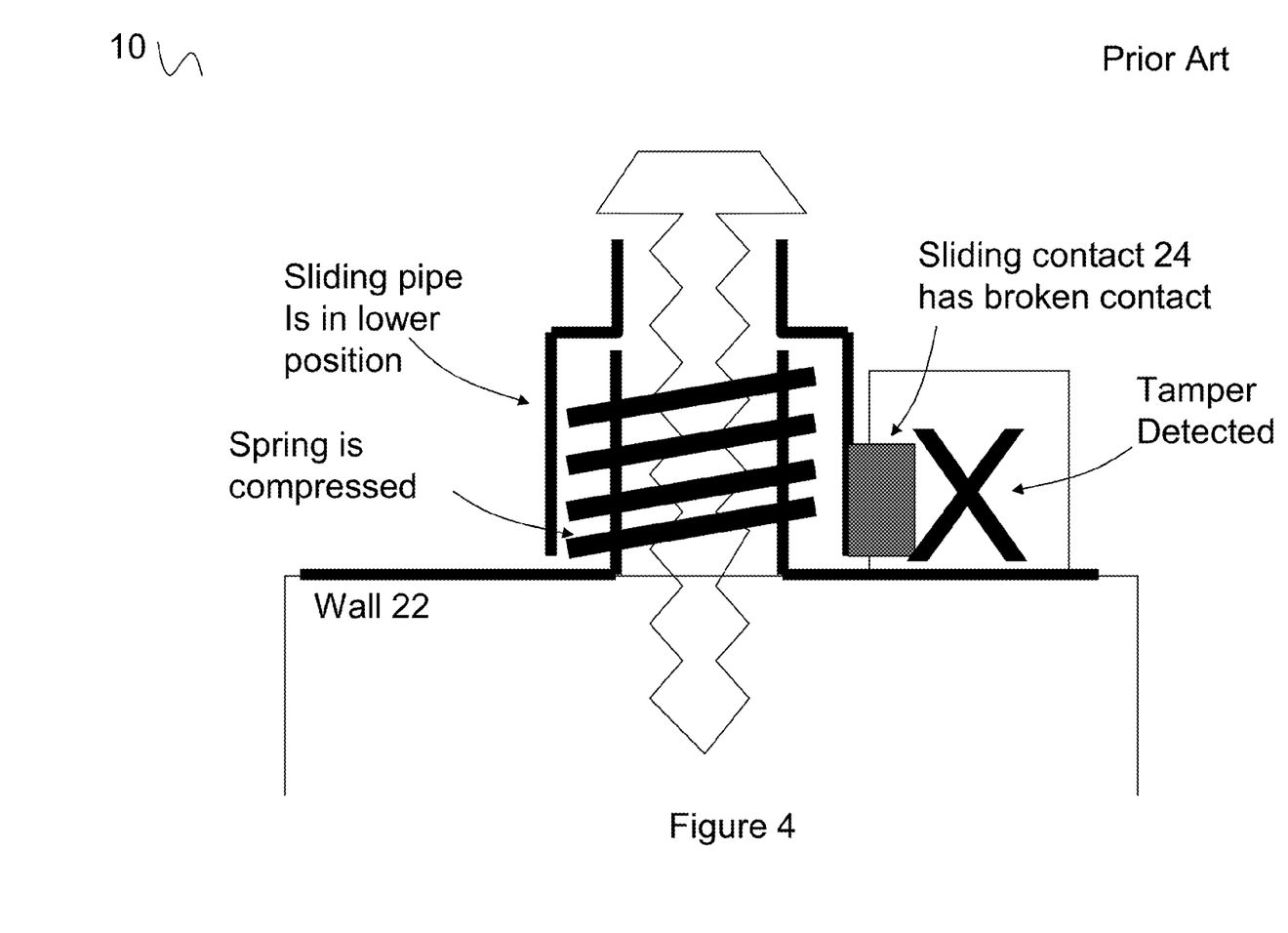
FIG. 4 is a component diagram of the prior art anti-tamper fixture of FIGS. 1 to 3 after tampering.

Referring to FIG. 4, the fixing system 10 is shown with the screw 12 slightly removed as if tampered with. The pipe 18 no longer forms a circuit with the tamper detection device 14 and the tamper detection device 14 records tampering as indicated with the large X in the box.

Figure 5:
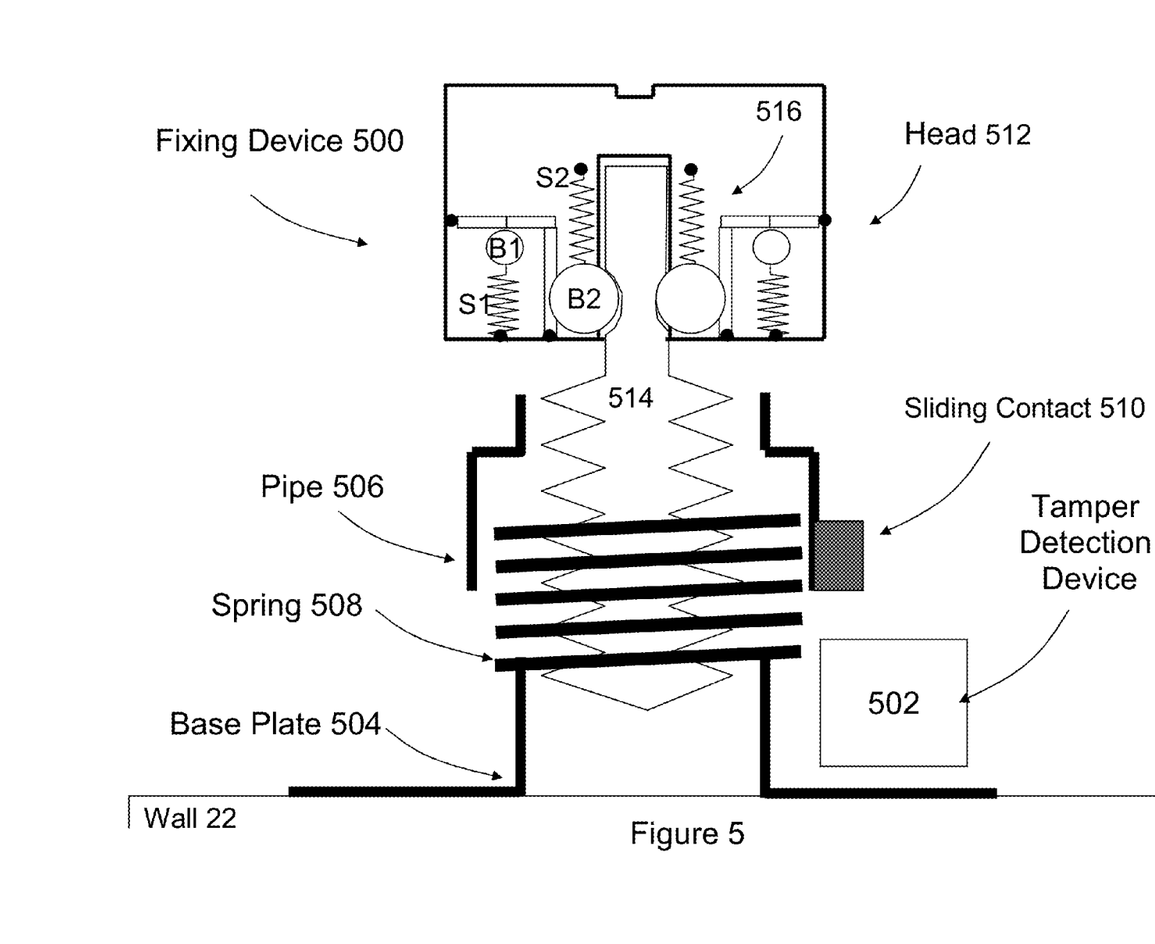
FIG. 5 is an exploded component diagram of a fixing system without an external magnetic field according to embodiments.

Referring to FIG. 5, an anti-tamper system for smart meter closure according to embodiments is shown. The anti-tamper system includes a fixing device 500, a tamper detection device 502, a base plate 504, a pipe 506 and a spring 508.

The fixing device 500 includes a head 512 and a body 514. The head 512 has a larger cross section than body 514 for enabling a tool to engage and drive the body 514 into a wall 22, thereby compressing the tamper detection device 502 between the head 512 and the wall 22.

The tamper detection device 502 is an electronic device that records when an electric circuit is broken.

The spring 508, when in compression, biases the fixing device 500 away from the base plate 504.

The pipe 506 includes a sliding contact 510 that makes an electric circuit in the tamper detection device 502 when the fixing device 500 fixes the tamper detection device 502 to a wall 22 of the smart meter closure. When fixing device 500 is not fixing the tamper detection device 502 to the wall 22 then the electrical circuit is broken and the break is recorded. The tamper detection device 502 is similar to a prior art tamper detection device 14.

Figure 6A:
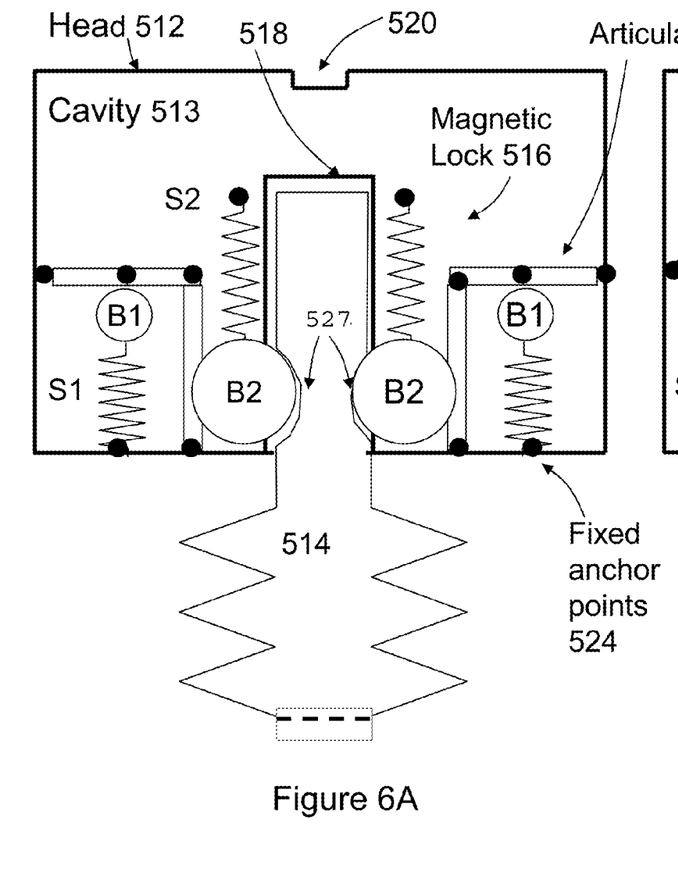
FIGS. 6A and 6B are enlarged component diagrams showing a locked and unlocked fixing device, respectively, according to embodiments.
Figure 6B:
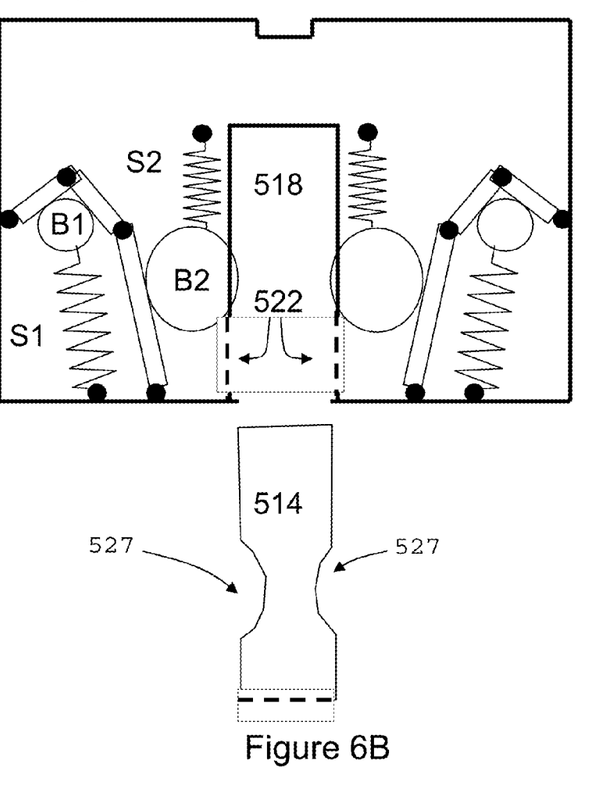

Referring to FIGS. 6A and 6B, locked and unlocked fixing devices are described in terms of a magnetic lock 516. In both figures only a partial body 514 is shown.

The head 512 includes a cavity 513, a magnetic lock 516, a recess 518, a slot 520, and a cavity opening 522. The head 512 is locked to the body 514 by the magnetic lock 516 when there is no external magnetic field (FIG. 6A). The cavity houses the magnetic lock 516. The recess 518 accommodates the body 514. The slot 520 is for engagement with a tool used to drive the fixing device 500 into a layer such as the wall 22. The head 512 becomes disengaged from the body 514 when the magnetic lock 516 is unlocked by an external magnetic field (for example in FIG. 6B).

In embodiments, the magnetic lock 516 comprises ball bearings B1 and B2, springs S1 and S2, fixed anchor points 524, and articulated guides 526.

The cavity opening 522 (seen indicated by the dashed line in recess 518 in FIG. 6B) is provided to allow access from the cavity 513 so that the magnetic lock 516 can engage with the body 514.

The ball bearing B1 is magnetically sensitive and is constrained by the compression spring S1 fixed to a fixed anchor point 524. In FIG. 6A there is no external magnetic field and the ball bearing B1 is shown connected to the spring S1 and the articulated guides 526 such that the spring S1 exerts a small compression force on B1 and the articulated guides 526 to keep them in a stable position. In FIG. 6A no other force is considered. The bearing B1 may also be magnetic so that sensitivity is increased.

In embodiments, the ball bearing B2 is not magnetic and is attached by tension spring S2 to a fixed anchor point 524. A long member of the articulated guide 526 is shown constraining the ball bearing B2 in the opening 522 in the recess 518 of the head 512 and in the recess 527 of the body 514 in FIG. 6A when there is no magnetic field. The ball bearing B2 would move towards its fixed anchor point but is constrained by the long member of the articulated guide. FIG. 6A is a factory preset position achieved by application of permanent magnets to achieve the unstable equilibrium. It is by design that the position, once lost, is difficult to achieve again.

The different states of the anti-tamper system are now described.

Figure 7:
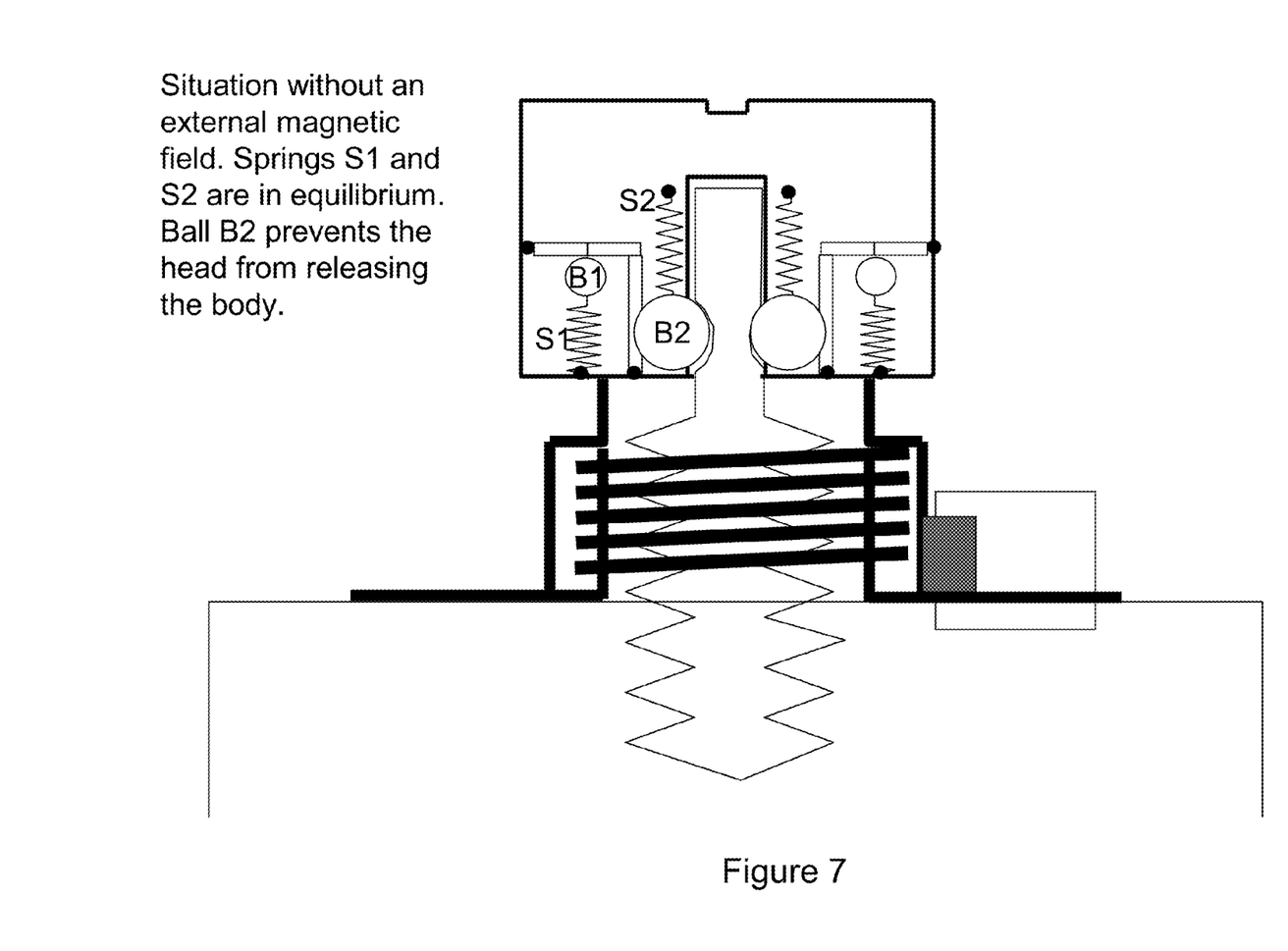
FIG. 7 is a component diagram of a fixing system fixed in place without a magnetic field according to embodiments.

Referring to FIG. 7, a locked state of the anti-tamper system is shown and there is no magnetic field. The ball bearing B1 and B2, the springs S1 and S2, and the articulated guides are in an equilibrium position. The ball bearing B2 prevents the head from releasing the body and therefore the tamper detection device from being set.

Figure 8:
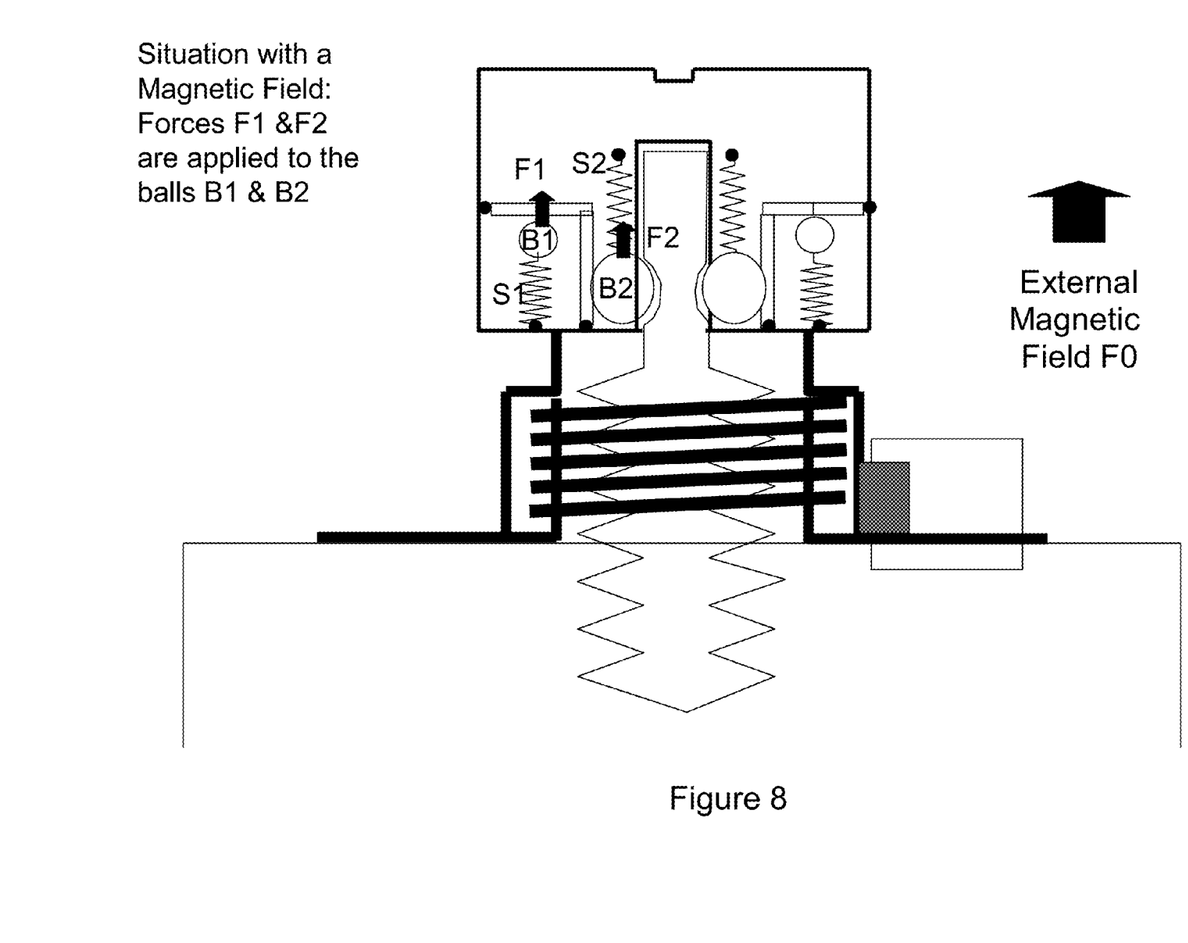
FIG. 8 is a component diagram of a fixing system in a fixed state when an external magnetic field is applied according to embodiments.

Referring to FIG. 8, a locked state of the anti-tamper system is shown when an external magnetic field F0 is first applied. A magnetic force F1 is shown acting on the ball bearing B1. A spring force F2 is shown acting on the ball bearing B2.

Figure 9:
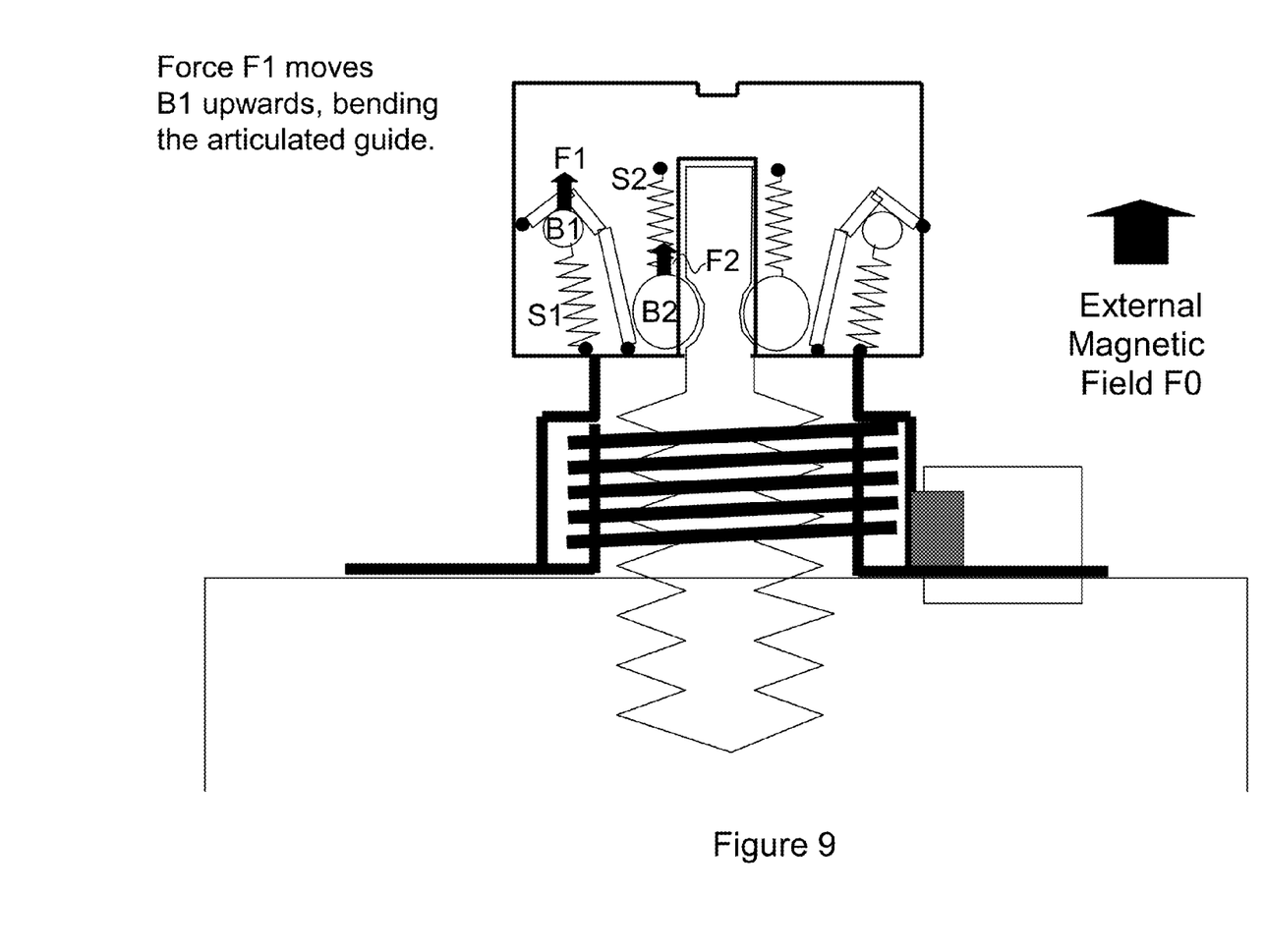
FIG. 9 is a component diagram of a fixing system in a first intermediary state after an external magnetic field is applied according to embodiments.

Referring to FIG. 9, a first intermediary state of the anti-tamper system with a magnetic field is shown. The force F1 moves ball bearing B1 upwards bending the articulated guide out of a restraining shape so that the ball bearing B2 is no longer restrained and can move in accordance with the bias of the spring S2.

Figure 10:
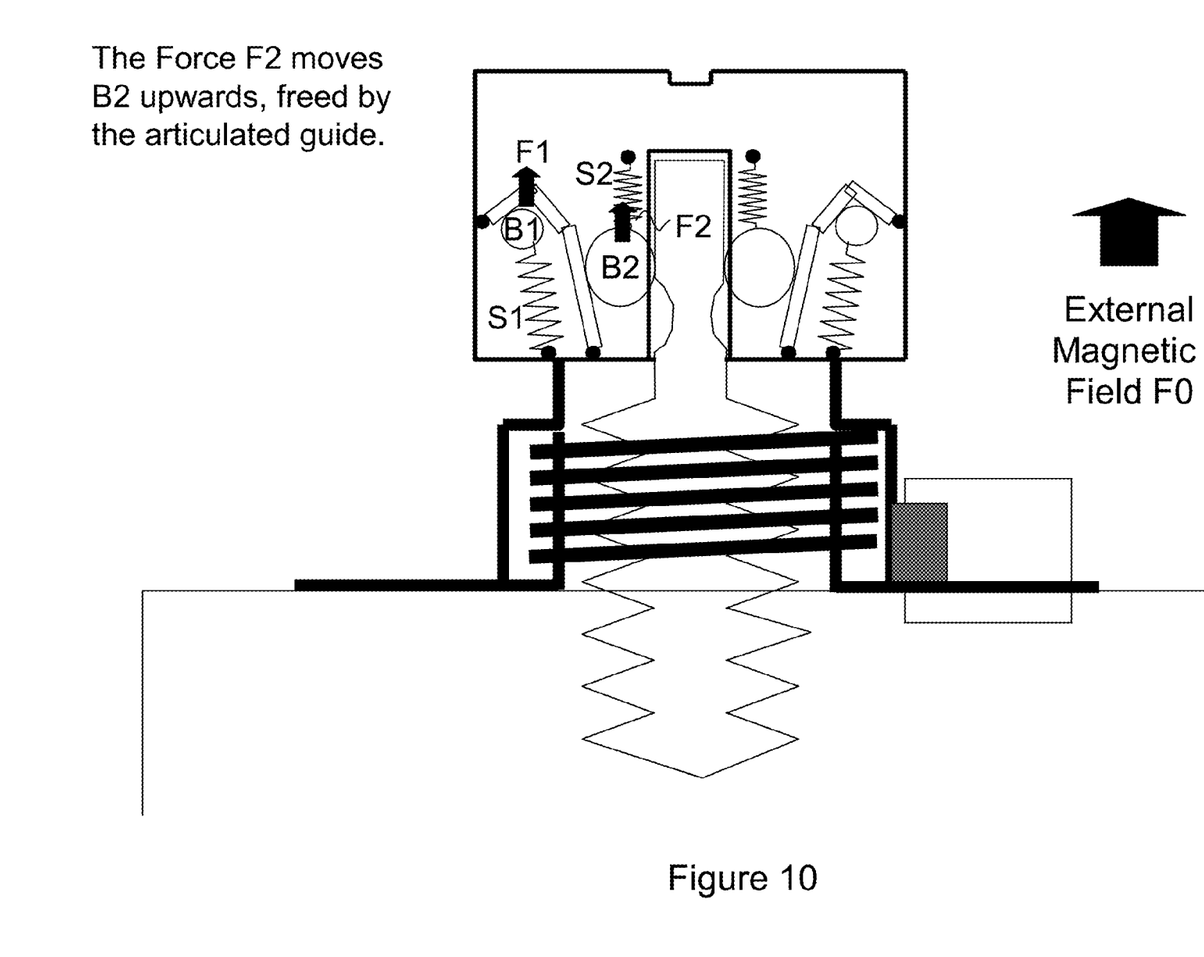
FIG. 10 is a component diagram of a fixing system in a second intermediary state after an external magnetic field is applied according to embodiments.

Referring to FIG. 10, a second intermediary state of the anti-tamper system with a magnetic field is described. The force F2 moves ball bearing B2 upwards, which is now unconstrained by the articulated guide. The ball bearing B2 is pulled free of the opening 522 and the recess 527 into the body of the cavity, thereby unlocking the magnetic lock and releasing the body 514 from the head 512.

Figure 11:
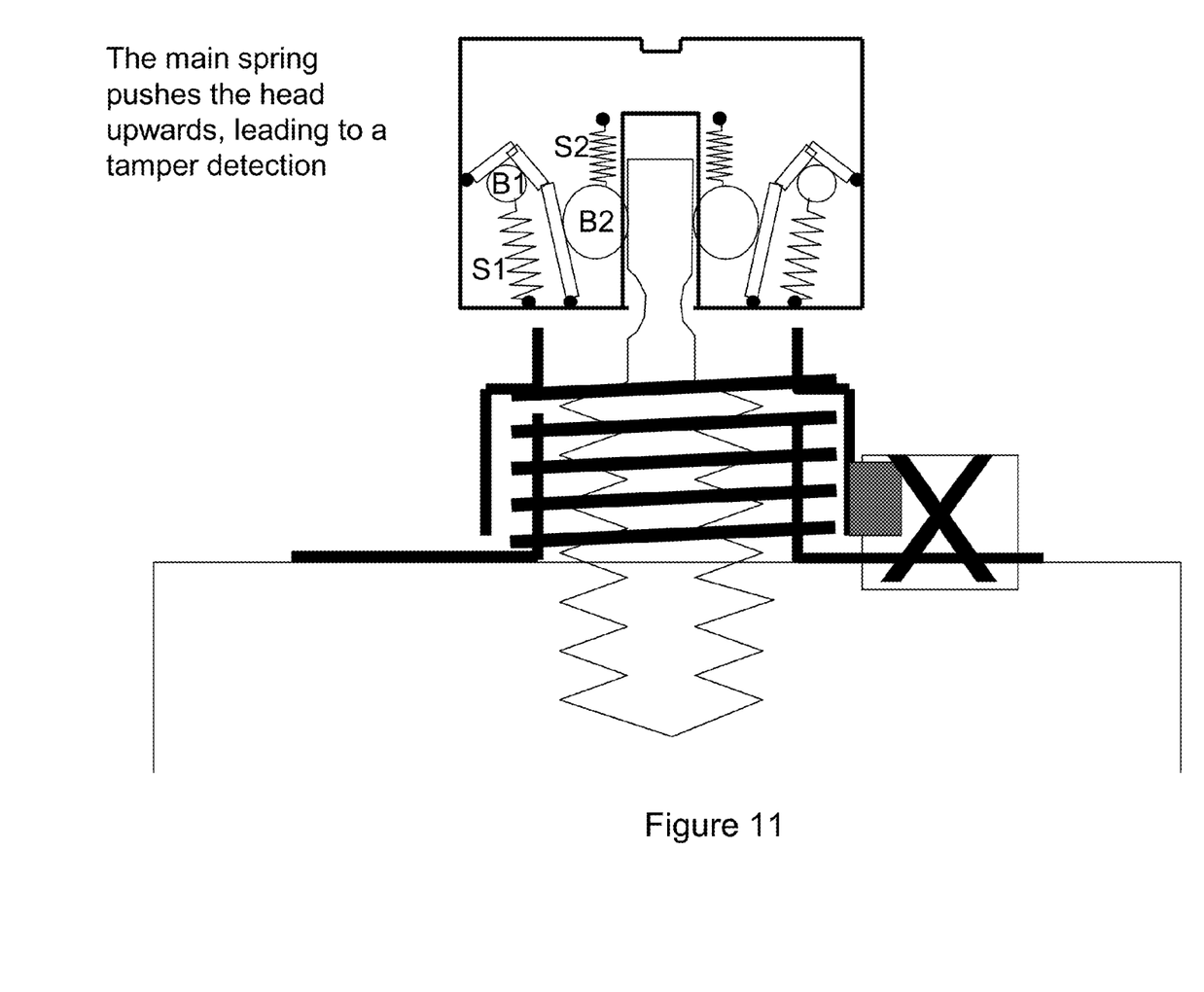
FIG. 11 is a component diagram of a fixing system in an unlocked state after a magnetic field is applied according to embodiments.

Referring to FIG. 11, an unlocked state of the anti-tamper system with an applied magnetic field is described. The main spring 508 pushes the head upwards leading to tamper detection via the tamper detection device as indicated by the X.

Therefore magnetic lock 516 comprises one or more moveable parts (e.g., ball bearings B1), which are sensitive to a magnetic field so to move and unlock the head 512 from the body 514 when an external magnetic field is applied. The magnetic lock 516 is biased by a threshold force in an unstable equilibrium position whereby when a magnetic counterforce greater than the threshold force is applied the ball bearings B1 and B2 move to a more stable equilibrium position thereby unlocking the head from the body.

Figures 12A, 12B:
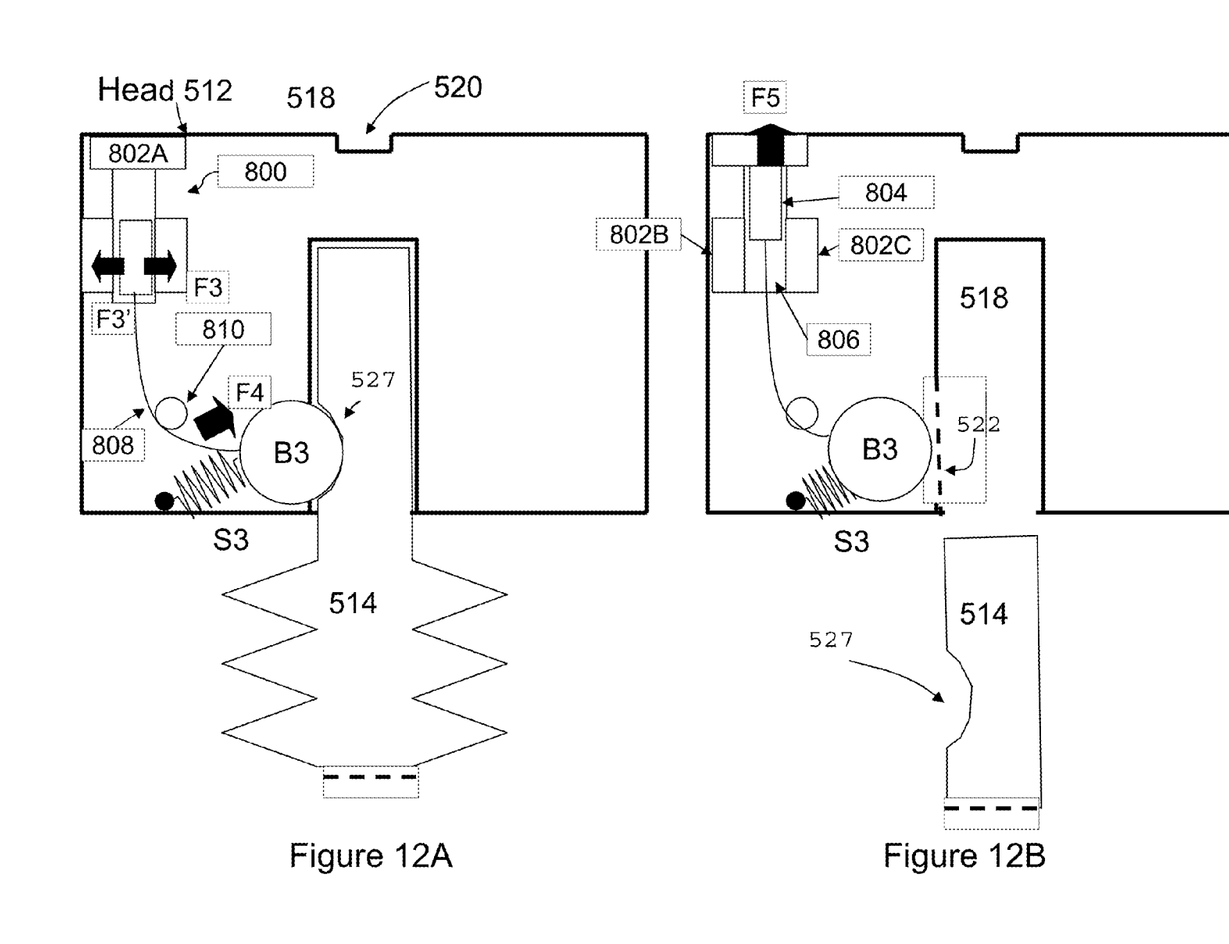
FIGS. 12A and 12B are close up component diagrams showing a locked and unlocked fixing device according to embodiments.

Referring to FIGS. 12A and 12B, other embodiments of the invention comprises a magnetic lock 800 within the head cavity having creating unstable and stable equilibrium states. The magnetic lock 800 comprises fixed permanent magnets 802A, 802B, 802C, a moving magnet 804, a magnet channel 806, a flexible connection 808, and a pulley 810. Only one magnetic lock is shown around body 514 but two or more are conceived in other embodiments.

The permanent magnets 802A, 802B and 802C are arranged around the magnet channel 806 so to create an unstable equilibrium position. The permanent magnets 802C and 802B are arranged opposite each other about the channel 806 to create a balance point indicated by opposite force arrows F3, F3'. At the balance point, the magnet 804 is being pulled in a direction opposite that of a force capable of overcoming a force F5 of the permanent magnet 802A.

The moveable magnet 804 is configured to slide in the magnet channel 806 between the unstable equilibrium position and the more stable equilibrium position.

The flexible connection 808 connects the moveable magnet 804 with a ball bearing B3.

The pulley 810 provides a pivot for the flexible connection 808 to bend so that space is used efficiently in the head cavity.

The ball bearing B3 is similar to the ball bearing B2 described above and engages with the opening 522 in the head 512 and the recess 527 in the body 514 to lock the two together.

A spring S3 pushes the ball bearing B3 into the recess 527 with a force F4 to keep the head 512 and the body 514 locked when in an unstable equilibrium.

Referring to FIG. 12A, the magnetic lock 800 is in an unstable equilibrium position where the moveable magnet 804 is balanced by the forces F3, F3' and F5.

Referring to FIG. 12B, an external magnetic force is applied that disrupts the equilibrium and allows a force F5 to dominate pulling the moveable magnet 804 into the magnet 802A. Consequently, the flexible connection 808 pulls the ball bearing B3 out of the recess 527 and opening 522, thereby unlocking the device.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The invention claimed is:

1. A fixing device, comprising:
   a body and a head, the head having a larger cross section than the body; and
   a lock for locking the head to the body and for disengaging the head from the body in response to an external magnetic field,
   wherein the lock is biased by a plurality of springs in an unstable equilibrium position, and wherein, when a magnetic counterforce greater than the force of the springs is applied by the external magnetic field, the lock moves to a more stable equilibrium position unlocking the head from the body.

2. The fixing device according claim 1, wherein the lock comprises at least one movable part, sensitive to an external magnetic field, for disengaging the head from the body when the external magnetic field is applied.

3. The fixing device according to claim 2, wherein each movable part is magnetic or metallic.

4. The fixing device according to claim 1, wherein one of the springs provides tension and another of the springs provides compression.

5. The fixing device according to claim 1, wherein the springs are coil springs.

6. The fixing device according to claim 1, wherein the springs comprise an elastic material.

7. A fixing device, comprising:
   a body and a head, the head having a larger cross section than the body; and
   a lock for locking the head to the body and for disengaging the head from the body in response to an external magnetic field,
   wherein the lock is biased by equilibrium forces of a plurality of permanent magnets in an unstable equilibrium position, and wherein, when an external magnetic counterforce greater than the equilibrium forces is applied by the external magnetic field, the lock moves to a more stable equilibrium position unlocking the head from the body.

8. An anti-tamper system comprising:
a fixing device;
an anti-tamper detection device;
the fixing device comprising a body and a head, the head having a larger cross section than the body;
the fixing device further comprising a lock for locking the head to the body when there is no external magnetic field and for disengaging the head from the body when the lock is unlocked by an external magnetic field; and
wherein the anti-tamper detection device detects and records a change in the connection when the head becomes disengaged from the body.

9. The anti-tamper system according to claim 8, further comprising: a spring, positioned between the fixing device and a first material layer, for creating a bias to remove the head from the body when the lock is unlocked.

10. The anti-tamper system according to claim 8, wherein the lock is biased by a threshold force in an unstable equilibrium position, and wherein, when an external magnetic force greater than the threshold force is applied by the external magnetic field, the lock moves to a more stable equilibrium position thereby unlocking the head from the body.

11. The anti-tamper system according to claim 8, wherein the lock is biased by two or more springs in an unstable equilibrium position, and wherein, when a magnetic counterforce greater than the force of the springs is applied by the external magnetic field, the lock moves to a more stable equilibrium position thereby unlocking the head from the body.

12. The anti-tamper system according to claim 11, wherein one of the springs provides tension and another of the springs provides compression.

13. The anti-tamper system according to claim 11, wherein the springs are coil springs.

14. The anti-tamper system according to claim 8, wherein the fixing device comprises one of: a screw, a bolt, a nail, or a rivet.

15. The anti-tamper system according to claim 8, wherein the lock is biased by equilibrium forces of two or more permanent magnets in an unstable equilibrium position, and wherein, when an external magnetic counterforce greater than the equilibrium forces is applied by the external magnetic field, then the lock moves to a more stable equilibrium position whereby the corresponding movement unlocks the head from the body.

* * * * *